US006280201B1

(12) United States Patent
Morris

(10) Patent No.: US 6,280,201 B1
(45) Date of Patent: Aug. 28, 2001

(54) LAMINATED 90-DEGREE CONNECTOR

(75) Inventor: Terrel L. Morris, Garland, TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/488,753

(22) Filed: Jan. 21, 2000

(51) Int. Cl.[7] .............................. H01R 12/00; H05K 1/00
(52) U.S. Cl. .................................. 439/65; 439/61; 439/74
(58) Field of Search .................... 439/65, 61, 74

(56) References Cited

U.S. PATENT DOCUMENTS

| 3,715,706 | * | 2/1973 | Michel et al. | 439/65 |
| 4,693,529 | * | 9/1987 | Stillie | 439/65 |
| 4,894,022 | | 1/1990 | Guckenheimer | 439/260 |
| 5,338,207 | * | 8/1994 | Lineberry et al. | 439/65 |
| 5,558,522 | * | 9/1996 | Dent | 439/65 |
| 5,715,146 | | 2/1998 | Hoppal | 361/796 |
| 5,823,795 | | 10/1998 | Schumacher | 439/76.1 |
| 6,042,390 | * | 3/2000 | Leung | 439/74 |

* cited by examiner

Primary Examiner—Brian Sircus
Assistant Examiner—Hae Moon Hyeon
(74) Attorney, Agent, or Firm—Leslie P. Gehman

(57) ABSTRACT

A connector for electrically and mechanically connecting two circuit boards at a substantially 90-degree angle. The 90-degree connector may include surface mount devices, connections for mechanically attaching to circuit boards, surface mount pads or pins for electrically connecting to the circuit boards. A printed circuit board connector constructed from materials with characteristics closely matching backplane and daughter card, minimizes reflections at interface and provides optimal signal performance. Connectors are manufactured using a process substantially similar to current printed circuit board processes allowing easy manufacturing. The connector may be manufactured from laminated printed circuit boards in a planar or cylindrical configuration.

21 Claims, 12 Drawing Sheets

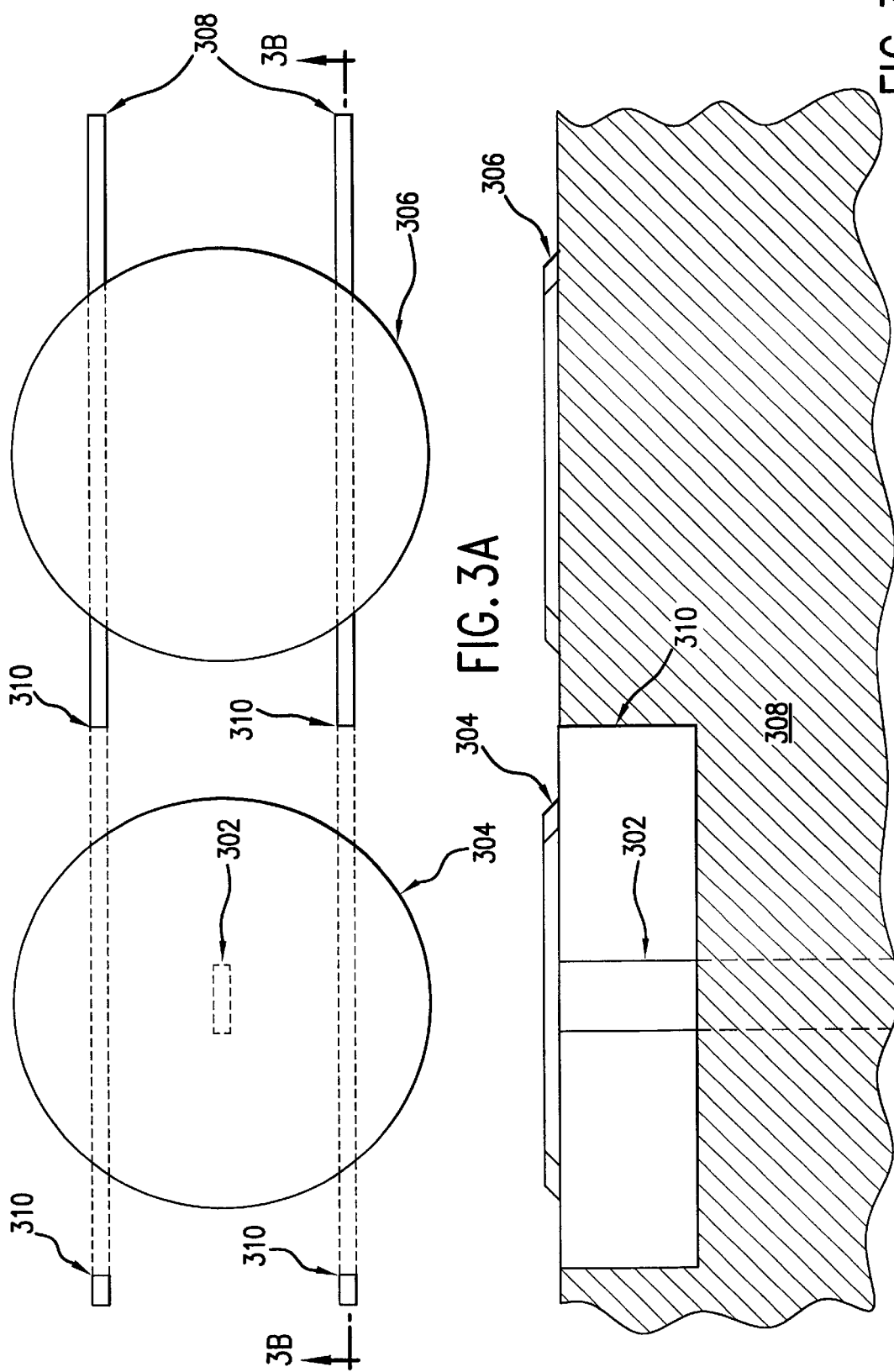

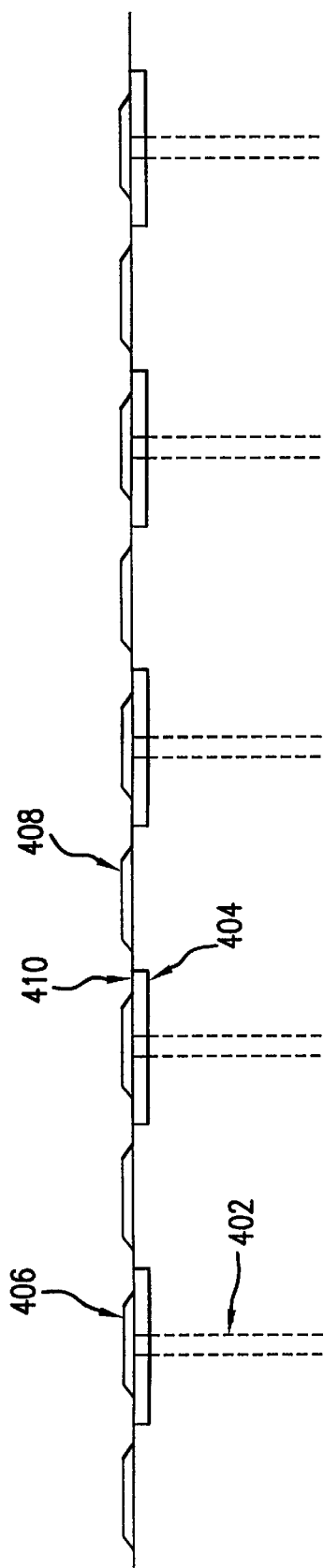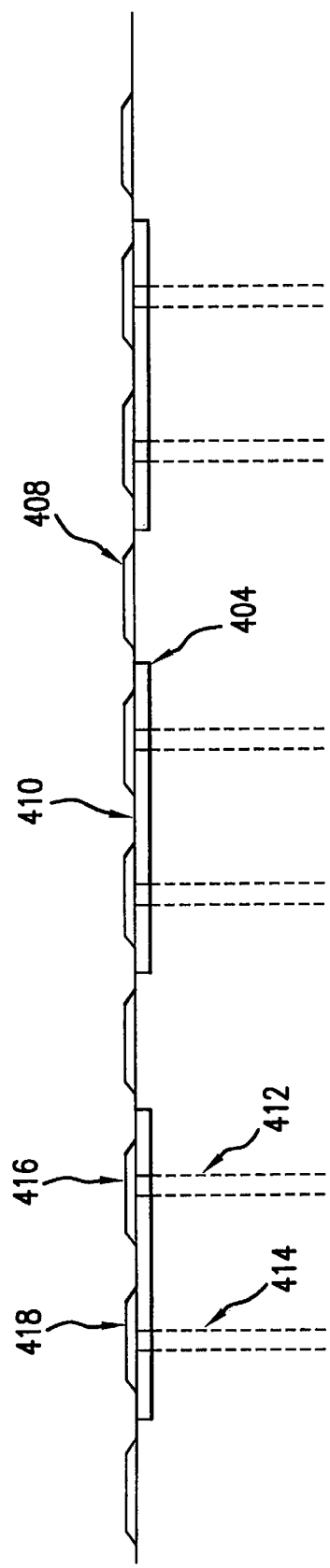

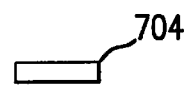
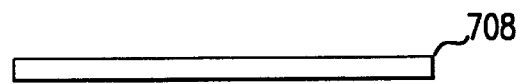
FIG.7A
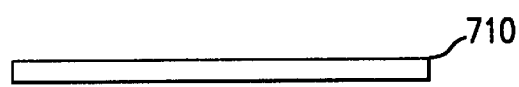
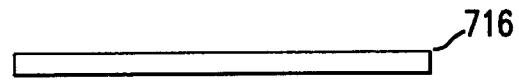
FIG.7B
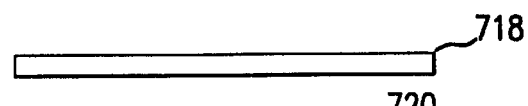
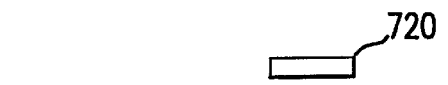
FIG.7C
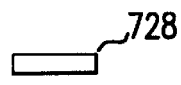
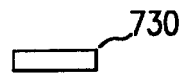
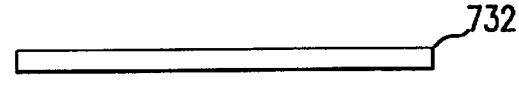
FIG.7D

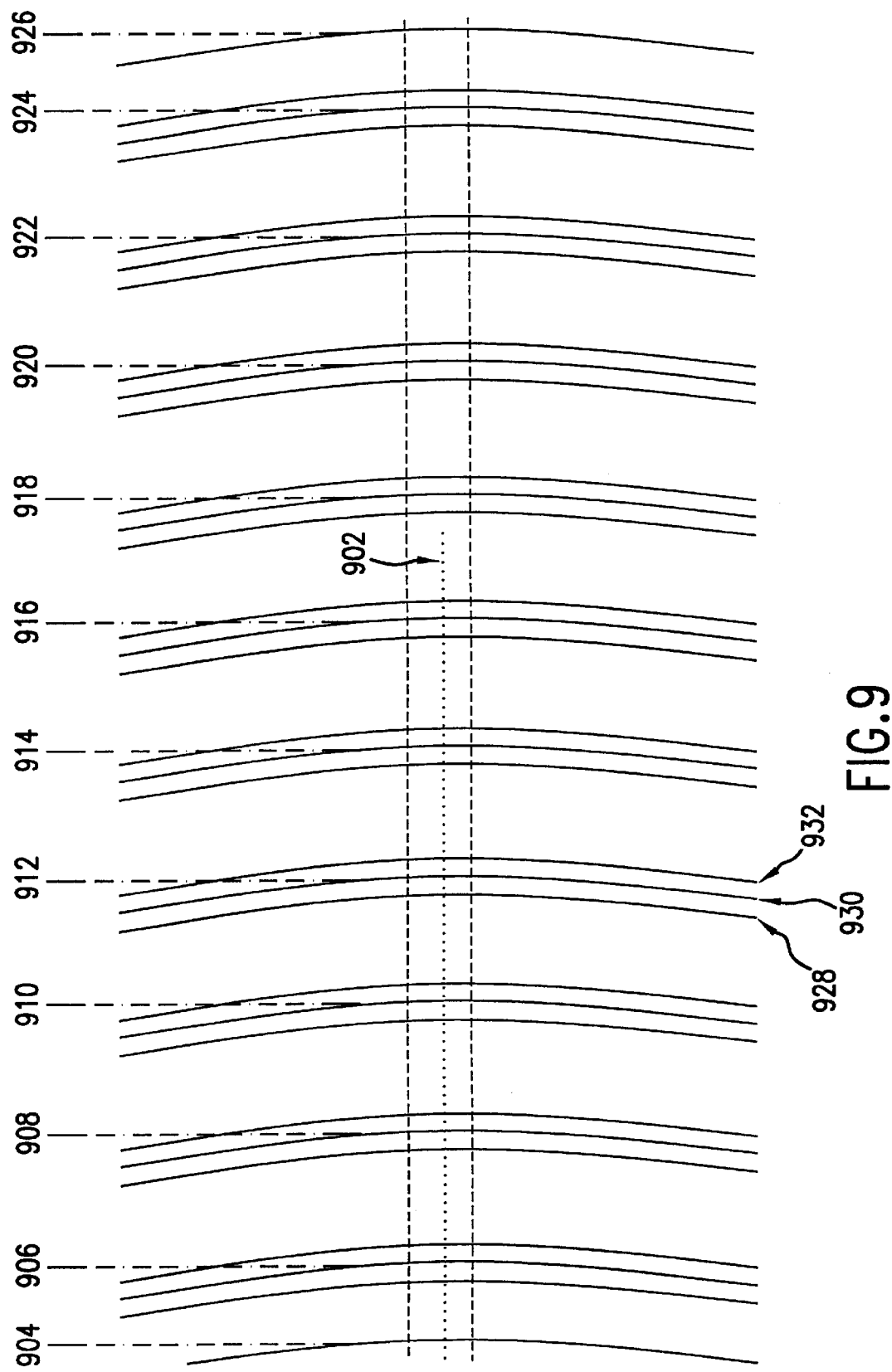

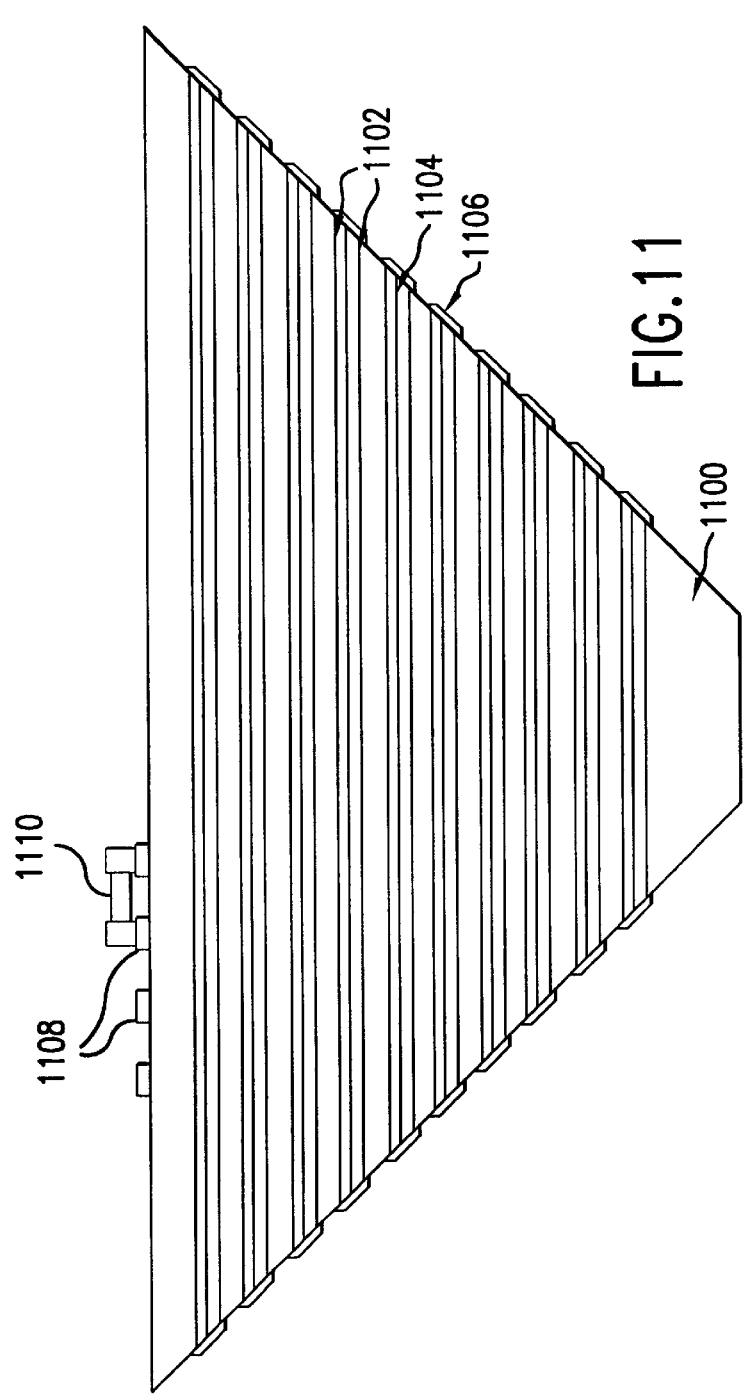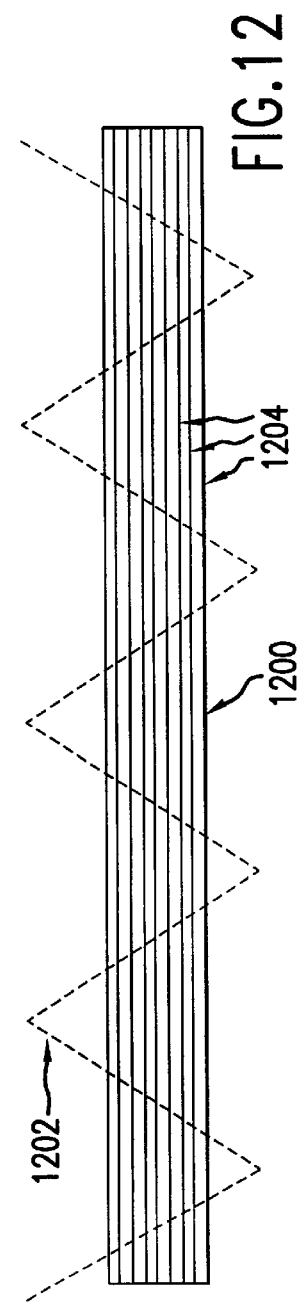

LAMINATED 90-DEGREE CONNECTOR

FIELD OF THE INVENTION

This invention relates generally to the field of electrical connectors and more particularly to an electrical connector for establishing high-speed signal and power interconnection between printed circuit boards.

BACKGROUND OF THE INVENTION

Printed circuit board connectors for coupling daughter cards to backplanes are well known in the art. However, the electrical properties of these connectors have historically limited high-speed designs. The simultaneous requirements for robust connectivity, serviceability, and excellent electrical properties have resulted in a series of design trade-offs that delivered less than optimal signal performance, particularly in the 90-degree configurations often used to connect a backplane to a daughter card.

Prior art demonstrates that many and various constructions have been utilized in order to achieve a 90-degree signal connection with good electrical properties. These constructions fall into several broad categories:

1. Constructions using stamped or formed metal pins, leads, or contacts to propagate a signal from one board interface to another board interface. These are further broken down into various types:
   A. Pin-field connector. These connectors utilize an array of signal pins to provide the signal path, and count on a certain number of those pins being connected to ground in order to enable a robust path for return currents. In high speed connections, these often have problems due to the large loop areas between signals and grounds, and the fact that the dielectric material varies from plastic to air at many intervals along the connected path. In addition, the inherent inductance of the metal pin per unit length is generally poorly matched with the inherent capacitance of the dielectric per unit length. As a result, the interconnects tend to be inductively dominated, and the resulting impedance at high frequencies is different than the desired impedance. This results in degraded signal quality across the connector. Signal-to-signal crosstalk coupling is typically high in this type of interconnect, further degrading signal quality.
   B. Stripline and Microstrip connectors using metal leads. This family of connectors are built around a planar structure, which is generally composed of a stamped or formed metal plate. The metal signal conductors are positioned in a deterministic relationship relative to the metal plate in a manner such that a pseudo stripline or pseudo microstrip structure is formed. The electrical characteristics of this type of connector are much better than those of pin field connectors, but still fall short of the electrical properties of the printed circuit board (PCB). Causes of signal degradation in this type of connector include mixed air/plastic dielectric, point discontinuities associated with contact features, and the amount of capacitance associated with large through-hole vias.
   C. Pseudo-coax and pseudo-twinax constructions. These connectors emulate the physical construction of a shielded conductor cable by surrounding a stamped or formed metal lead with a complete or partial shield. The shield can be constructed of metal, or alternatively be a molded plastic assembly plated, painted, or coated with a metal conductive shield. As with the previous constructions, the metal lead is surrounded with a combination of plastic and air dielectric. These connectors offer very good electrical performance when compared to pin fields, but do not provide the level of performance found in PCBs. Causes of signal degradation in this type of connector include mixed air/plastic dielectric, point discontinuities associated with contact features, and the amount of capacitance associated with large through-hole vias.
2. Constructions using flexible circuits. These connectors address signal quality requirements by producing a printed circuit construction, complete with ground planes, within the confines of the 90-degree contact. This is achieved by manufacturing flat sections of circuit material, and then bending them to 90 degrees. Various types of contacts have been used, including gold bumps, rubber elastomers pressing against gold pads, and heat-activated springs. While flexible circuit performance can help address some of the issues associated with stamped or formed metal leads, they have their own problems:
   A. A stripline construction requires three conductor layers, while the standard materials and processes produce two layers. As a result, microstrip constructions are often used, that have higher crosstalk and more EMI radiation than stripline. Alternatively, stripline structures are produced in a layer stackup that is more difficult to produce and more difficult to bend than non-stripline structures because of the skin structure formed by the two outer copper ground layers.
   B. Because of the difficulty in manufacturing multi-layer, controlled-impedance flexes with more than one stripline layer, yields are very low for interconnects offering high density.
   C. In order to achieve density with a low layer count, many flex interconnects are produced with extremely fine lines and close spacing between lines. Fine lines add attenuation to the signal path, and close spacing increases crosstalk.
   D. The flexible nature of the contact materials requires that the connector have specific and often expensive alignment hardware to ensure connectivity between flex pads and board features.
3. Constructions using coax or twinax cable. Used under the most stringent performance conditions, these connectors are constructed of sections of cable materials attached to small PCBs or plastic contact carriers. (For example see Schumacher, U.S. Pat. No. 5,823,795.) While signal quality of these connectors is quite good, manufacturing costs are usually prohibitive for all but the most expensive systems.

There is a need in the art for a high-performance, easily manufacturable, connector with electrical properties matched to the system. This connector must be mechanically robust, inexpensive, and available in a wide range of sizes.

SUMMARY OF THE INVENTION

A 90-degree board-to-board connector is constructed in a manner that provides stripline signal paths made of the same materials used in printed circuit boards. A unique manufacturing process allows a variety of signal and ground combinations while simultaneously allowing volume production.

The connector has much shorter discontinuities and electrical loop area than those using stamped or formed metal conductors. This results in less loss of signal quality due to signal/return path mismatch, less EMI, and more robust performance during massive single-ended switching events.

The connector can be constructed of the same materials as the PCB, thus discontinuities can be minimized and electrical properties such as propagation mode and dispersion loss may be closely matched to the PCBs. Alternatively, the connector may be constructed of different materials, as required for mechanical properties or thermal expansion.

The connector does not require large through-hole vias for metal pins. As a result via capacitance, a major performance limiting parameter, may be greatly reduced. Typical via diameters for metal pins range from 20–40 mils (0.508–1.016 millimeters). Typical vias for surface mount applications range from 6–12 mils (0.1524–0.3048 millimeters). As the via diameter is reduced, pad diameter is reduced, and via capacitance is reduced. Furthermore, blind vias may be used. Blind vias greatly reduce via inductance and capacitance by reducing via length to less than one board thickness. Thus, both via diameter and via length may be reduced over what can be accomplished with any version of through hole connector.

The connector provides very small power/signal/ground loops for applications that carry power through the connector. This results in less power noise, but also provides a balanced return path throughout the entire PCB-to-PCB path for both power return and signal return. Thus, a board stackup that uses power layers as reference layers may effectively propagate signals to another board with the same stackup.

Unlike connectors that use sections of coax or twinax cable, and are essentially hand-built, this design may be built in volume using fully automated processing.

Stripline geometries reduce crosstalk and further enhance electrical performance of the connector. Close spacing of the signal and ground pads permits optimal performance by increasing effective shielding in the Z-axis, i.e. the via patterns in the PCB.

Unlike multi-layer flex connectors, this connector achieves very high density without requiring signal vias between layers in the connector. This greatly enhances manufacturability and electrical performance over flex versions.

Many aspects of the design may be varied while still using the basic design and manufacturing process steps described. Thus the connector may be easily adapted to the specific requirements of many different applications.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 3A and FIG. 3B are drawings showing how pads may be selectively connected to ground layers or signal traces as required.

FIG. 4A and FIG. 4B are drawings showing how connection patterns for single-ended and differential signals may be optimized.

FIG. 7A through FIG. 7D are drawings showing four of the more efficient types of stripline layers that may be constructed in the connector.

FIG. 9 is a detailed view of the cut line.

FIG. 11 is a side view of a 90-degree connector built using a flat PCB process.

FIG. 12 is a drawing of a flat PCB with cut-lines to form a number of 90-degree connectors.

DETAILED DESCRIPTION OF THE PREFERRED EMBODIMENTS

Figure 1:
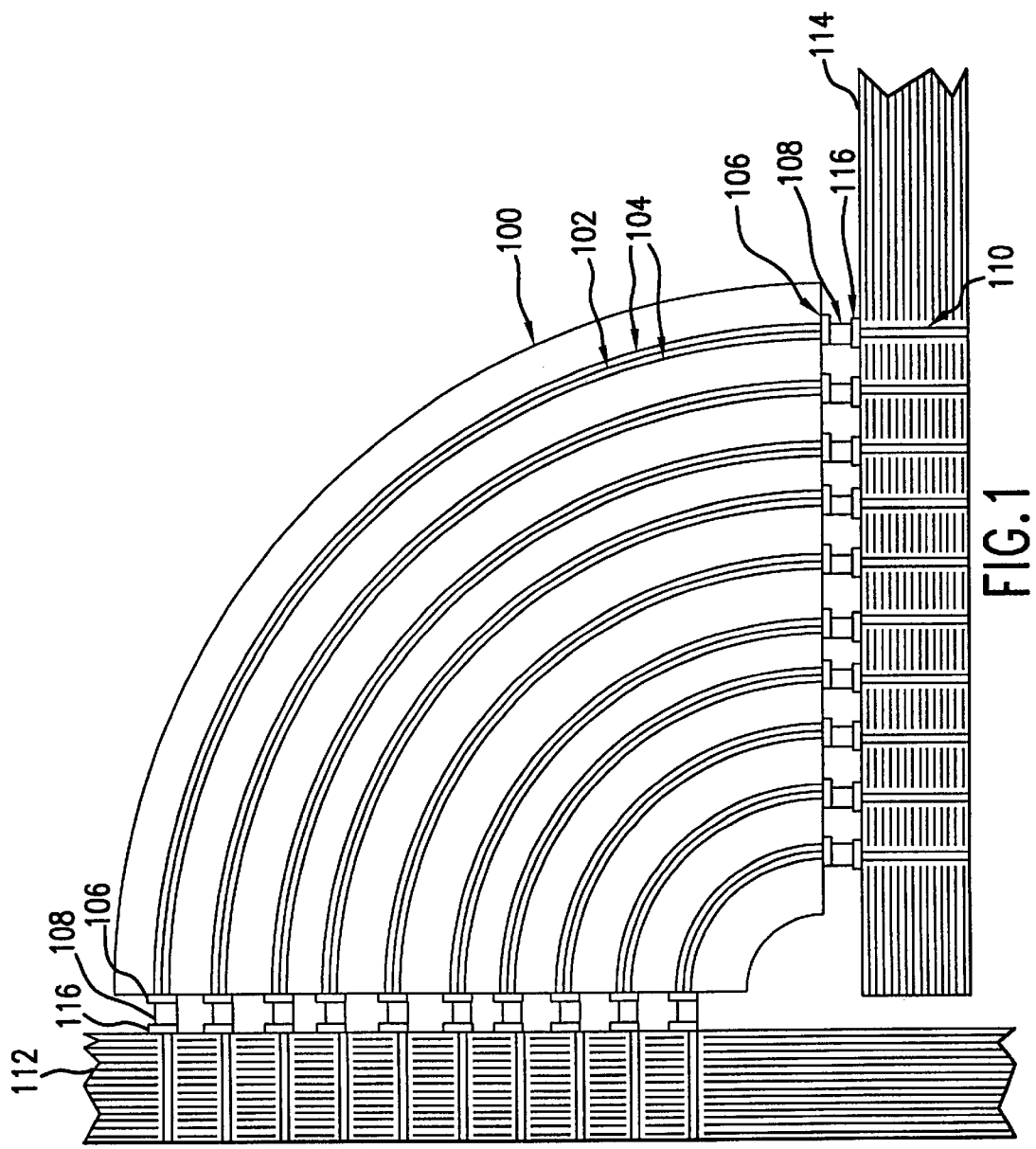
FIG. 1 is a drawing of the cross-section of the connector assembly connecting a backplane to a daughter card.

FIG. 1 is a drawing of the cross-section of the connector assembly 100 connecting a backplane 114 to a daughter card 112. In this embodiment of the invention, the laminated connector board has been constructed in a printed circuit board type of process around a cylindrical core. This printed circuit board cylinder was then sectioned along the lengthwise axis into quadrants forming four 90-degree laminated connector boards. An example of the type of process used to build this cylindrical printed circuit board is shown in FIG. 6A through FIG. 6L and described below. The connector assembly 100 connects a backplane 112 to a daughter card 114. The connector assembly 100 features plated pads 106, that use an array of elastomeric, stamped, or fuzz-button interposer contacts, or solder balls 108 to connect to PCB pads 116 and vias 110. The plated pads 106 are formed on the edges of the board where the cylinder was cut into quarters. Signal conductors 102 are surrounded by ground planes 104, using spacing and dielectric materials common to PCBs. The signal conductors 102 and ground planes 104 are designed such that only one signal reaches the cut lines of the cylinder so that when the plated pads 106 are formed there are no electrical shorts between adjacent traces. Thus each signal layer may be completely shielded from each adjacent layer. The length of the connectors may be set by the desired number of signal/power/ground traces that need to be connected between the backplane 112 and a daughter card 114. Since signals propagate in the same conductor materials as the PCB, and are surrounded by the same dielectrics as used in a PCB, they travel at the same velocity, and in the same mode of propagation as signals within the PCB.

Figure 2:
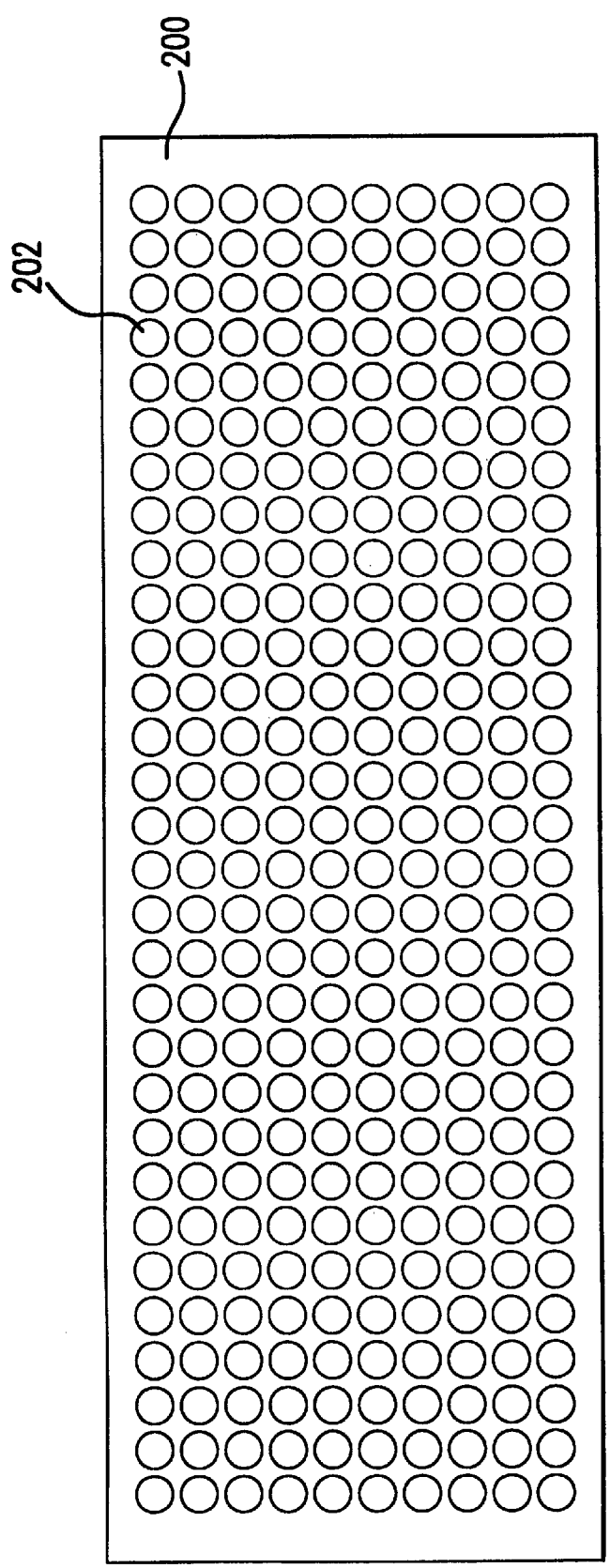
FIG. 2 is a drawing of one of the possible pad array patterns that can be plated on the flat side of the connector assembly.

FIG. 2 is a drawing of one of the possible pad array 202 patterns that can be plated on the flat side of the connector assembly 200. Note that the pad shape, distance between pads on vertical or horizontal axes, pad material, and plated coatings may be varied as required by the system application. Also, the number of pads may be varied as required. Alternatively, a standard set of laminated 90-degree interconnects may be built to fulfill the majority of design needs, eliminating the need to custom design an interconnect for each application.

Figure 10:
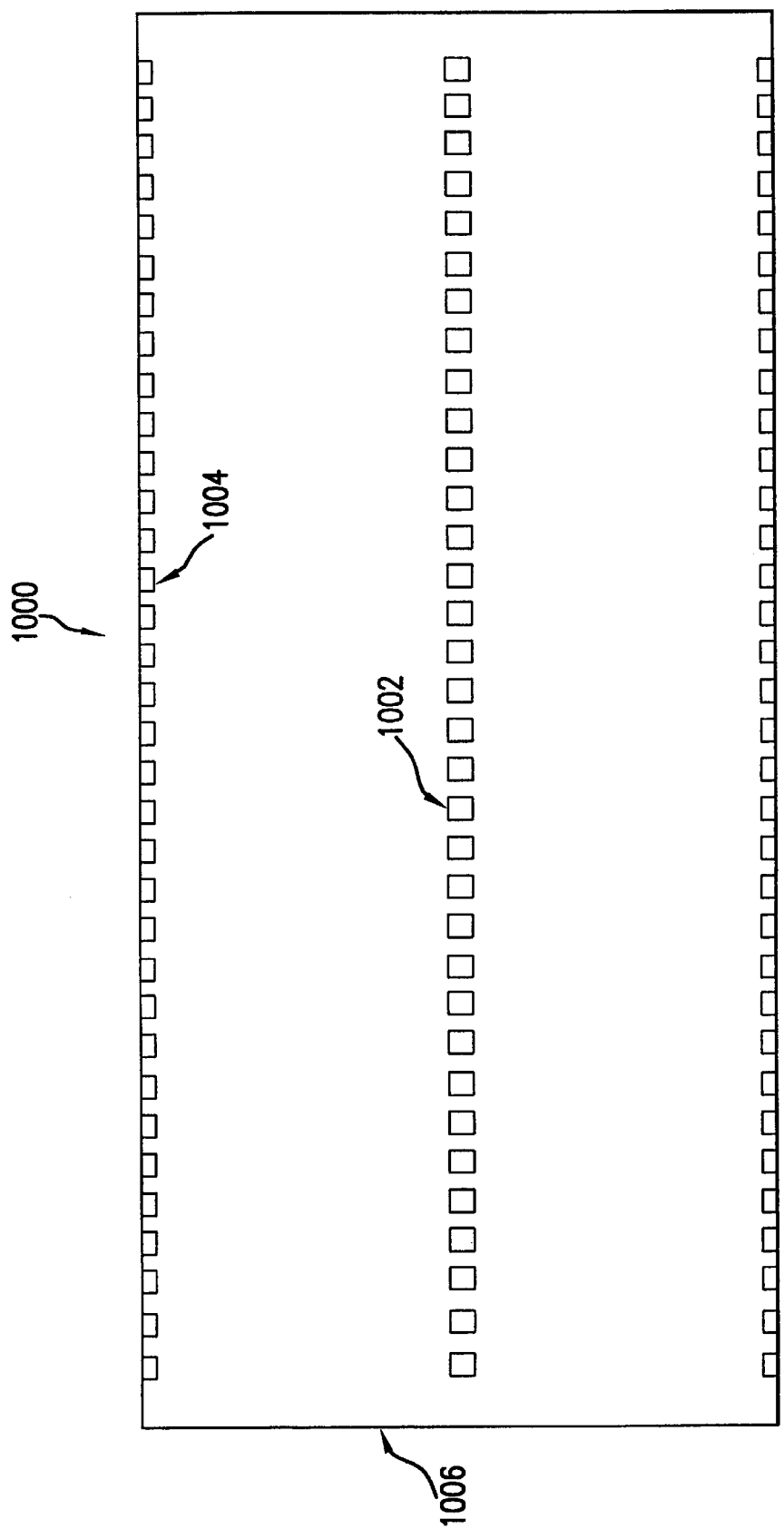
FIG. 10 is a side view of a cylindrical printed circuit board prior to cutting, with square cutouts in place.

FIG. 3A and FIG. 3B are drawings showing how pads may be selectively connected to ground layers or signal traces as required. FIG. 3A is a top view showing how signal trace 302 is connected to pad 304, but isolated from ground layers 308. In FIG. 3A, pad 306 is connected to ground layers 308, providing a low-impedance ground connection to the PCB. In the side view, FIG 3B, the connection between signal trace 302 and pad 304 is illustrated, as well as the isolation from ground layers 310. Note the cut 310 in the ground layer 308 around the signal pad 304. FIG. 10, described in detail below, is a representation of one possible ground plane design. The plurality of cut outs, 1002 and 1004, in the ground plane may be seen in FIG. 10. This keeps the ground layer 308 from shorting to the signal trace 302 through the signal pad 304. The connection between pad 306 and ground layers 308 is also illustrated. It may be desirable to limit the plane layers to protrude to the surface only in areas directly under the pads, so that no plane materials are exposed in areas not covered by pads. Alternatively, one ground layer of the pair may be assigned to power, creating a power-signal-ground stackup. The example shown uses 4 mil wide signal lines and 24 mil diameter pads on a 40 mil pitch, but many combinations of signal and pad geometries are possible using the techniques described in this document.

FIG. 4A and FIG. 4B are drawings showing how connection patterns for single-ended and differential signals may be optimized. Selective connections between pads and signals or pads and power/ground layers may be used to create structures that are ideal for certain types of signal propagation. Signal trace 402 is connected to signal pad 406, that is plated onto the flat surface of the connector body 410, but not connected to power/ground layers 404. Pad 408 is connected to power/ground layers 404, but not to the signal trace 402. In this pattern, signal pads 406 alternate with ground pads 408. Utilization of the pattern shown allows a 1:1 signal to ground ratio at the pad array and in the PCB vias, optimizing single-ended performance.

Likewise, FIG. 4B shows a differential pattern that has been optimized for true-complement pairs of signals. In this case, the pair of signal traces 412 and 414 are connected to pads 416 and 418, that are plated onto the flat surface of the connector body 410, but not connected to power/ground layers 404. Pad 408 is connected to power/ground layers 404, but not to the signal traces 412 and 414. In this pattern, groups of two signal pads 416 and 418 alternate with ground pads 408. Since two adjacent pads are used for signal traces, true-complement coupling is optimized within a signal pair, but the ground connections between pairs prevent excessive pair-to-pair coupling.

Using the basic techniques shown in FIG. 4A and FIG. 4B, many combinations of pad, signal, power, and ground combinations may be utilized to ensure optimal interconnect performance for many different signaling applications.

Figure 5:
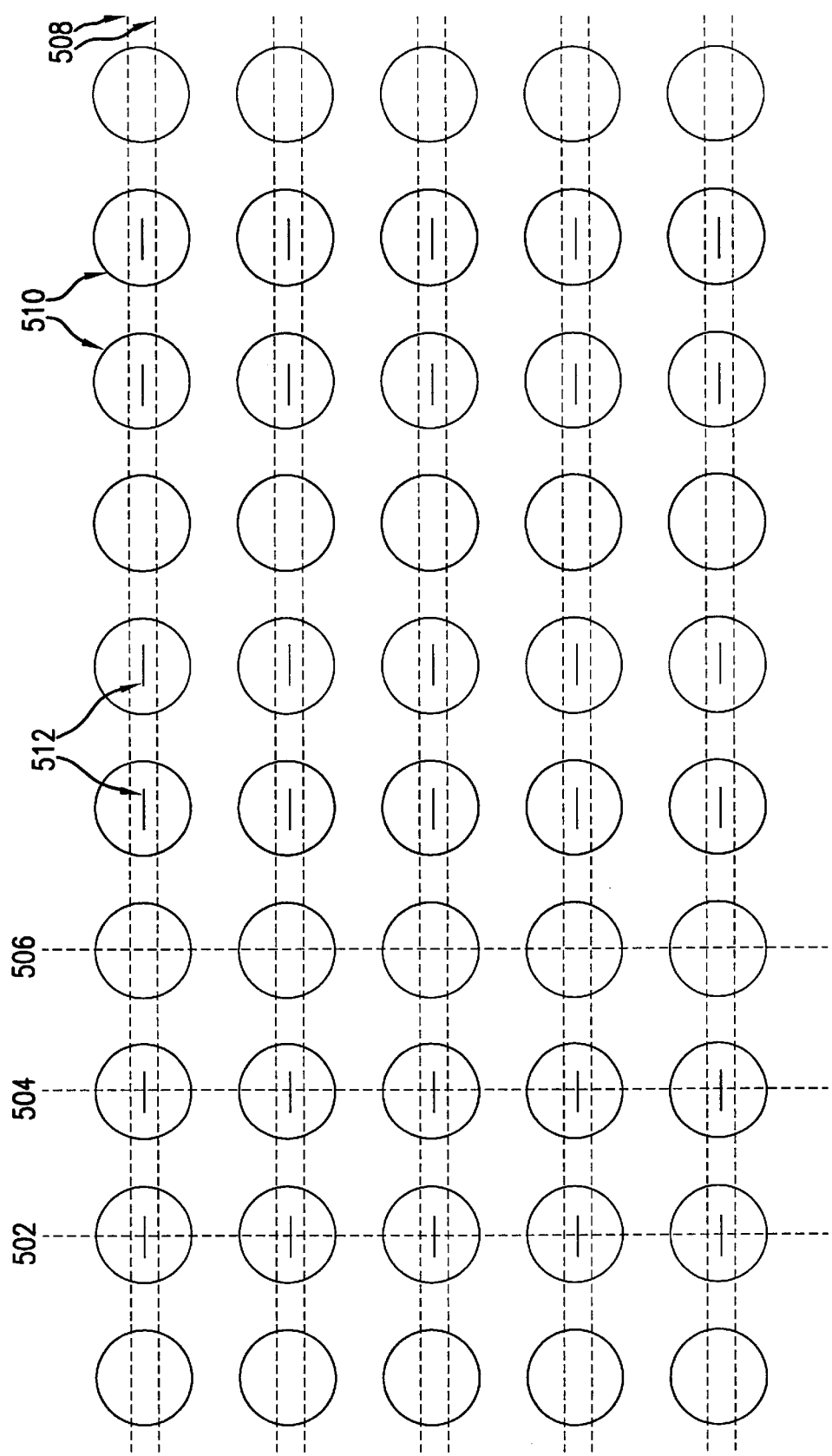
FIG. 5 is a drawing of a differential signal array as viewed looking into a flat side of the connector.

FIG. 5 is a drawing of a differential signal array as viewed looking into a flat side of the connector. An array of signals 512 sandwiched between power/ground planes 508 are connected to an array of circular pads 510. Signal column 502 is comprised of "true" signals, signal column 504 is comprised of "complement" signals, and the true-complement pairs are surrounded by power/ground columns 506. Note that this configuration is only one of many possible signal configurations. Staggered, inter-digitated, and offset patterns are also possible. Pad shape may also be oval, "dogbone", square, or any other shape as dictated by connectivity optimization, capacitance minimization, and design rules.

FIG. 6A through FIG. 6L consist of twelve process step descriptions showing one method for constructing the connector. In brief, a cylinder is formed, comprising concentric layers of connecting metal, separated by concentric layers of dielectric material. A series of process steps are followed, many of them taking advantage of the fact that the cylinder may be rotated during each process step. The rotation of the cylinder about the lengthwise axis eases application of materials, curing steps, imaging, roll forming, and steps requiring immersion or partial immersion in liquids. The finished cylindrical printed circuit board is then axially cut into four quadrants, and pads are plated where needed on the flat surfaces formed by the cutting operation. Hardware is then added for alignment, connection, and attachment to PCBs.

Figure 6C:
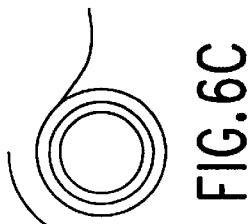
FIG. 6A through FIG. 6L consist of twelve process step descriptions showing one method for constructing the connector.
Figure 6B:
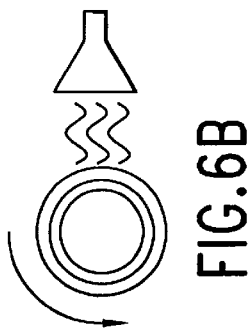
Figure 6A:

In FIG. 6A dielectric layers are wound around a form made of metal, glass, ceramic, plastic, or any other material deemed suitable for this application. The dielectric may be wound in individual strands, as is common in the manufacture of fishing rods and fiberglass radio antennae. It may be rolled on in sheets or layers, or it may be sprayed in place. If it is rolled on in sheets or layers, the seams thereof may be aligned by indexing them to occur in a specific position on the cylinder. The dielectric material may be epoxy/glass, Teflon, mylar, or ceramic, as required to match the properties of the circuit boards being connected. If required, an opposing roller may be used to control thickness of the dielectric to precise dimensions.

In FIG. 6B the dielectric layers are cured as required. Ultraviolet light, infrared heat lamps, ovens or other curing processes may be applied as needed to meet the requirements of the materials.

In FIG. 6C copper (or other metal) foil is applied to form a conductive layer. This metal may be coated with adhesive and rolled in place, may be plated in place, sputtered in place, or otherwise deposited on the outside of the cylinder. Alternatively, and additive process may be used. For example, the signal traces may be made of round, flat, or oval wire, wound in place around the cylinder. This wire may be plain, or may be coated with dielectric materials and adhesive materials.

Figure 6E:
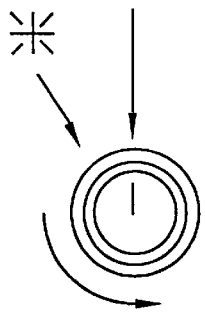
Figure 6D:
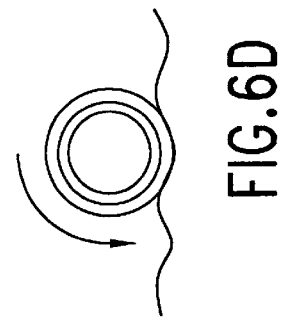

In FIG. 6D photo-resist material is added to the metal layer to provide a means of controlled pattern etching if a subtractive process is to be used. If the metal application process to / is an additive process, i.e. the signal traces and ground layers are selectively applied, then this step is not needed.

In FIG. 6E the photo-resist material is imaged as required to provide proper signal trace width and location, or proper power/ground pattern images. If the metal application process to be used is an additive process, then this step is not needed.

Figure 6H:
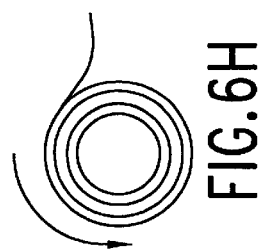
Figure 6G:
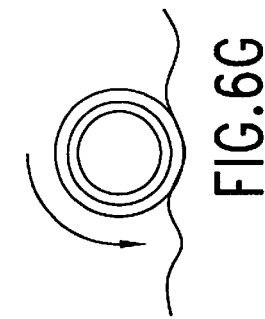
Figure 6F:
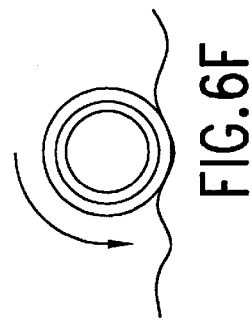

FIG. 6F shows the etching of the metal layers as required. If the metal application process to be used is an additive process, then this step is not needed. Alternatively, if metal were deposited, plated, rolled, formed, or otherwise applied in uniform fashion to the cylinder, a mechanical cutting process or laser imaging process could be used to form individual conductors as required.

In FIG. 6G the photo-resist, if used, is stripped from the cylinder and the surface prepared for the next dielectric layer. If alternative metal processes or wire processes were used in the creation of signal traces, then the appropriate surface preparation process step is used in place of photo-resist.

FIG. 6H shows the addition of the next dielectric layer, using the same process as shown in FIG. 6A, or with appropriate process variations as required to maintain proper thickness, adhesion, or other desired properties.

Figure 6J:
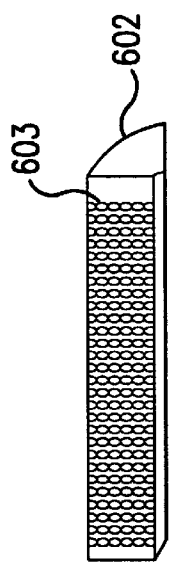
Figure 6L:
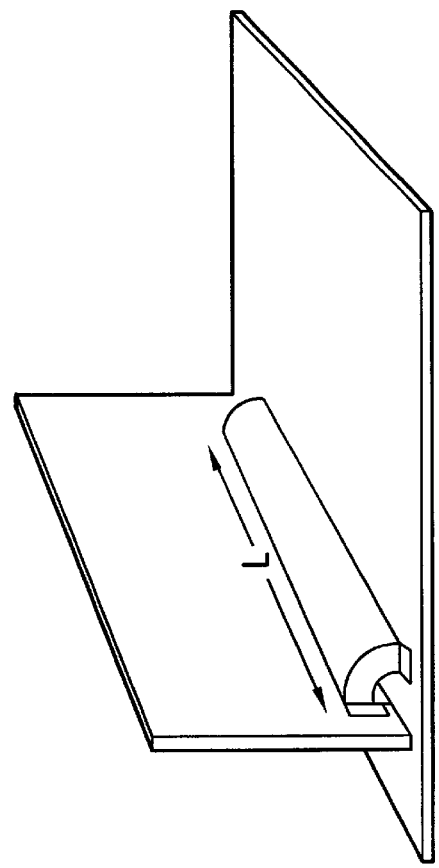
Figure 6I:
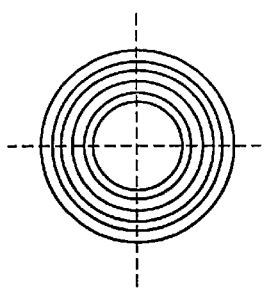

In FIG. 6I the formed cylinder is sawn, cut, laser cut, or otherwise separated into quadrants. If required, the flat surfaces formed by the cutting operation may be sanded, buffed, polished or otherwise prepared for the addition of surface pads.

The surface pads are shown in FIG. 6J. These may be imaged and plated, as in standard PCB processes, or alternatively sputtered, formed, or welded in place. Pads may then be plated with the desired surface finish, including, but not limited to gold, palladium/nickel, tin/lead, or tin/antimony. In place of separate pads, the interposer connection array may be directly welded, plated, or otherwise conductively attached to the signal traces and ground planes exposed on the flat surface of the connector.

Figure 6K:
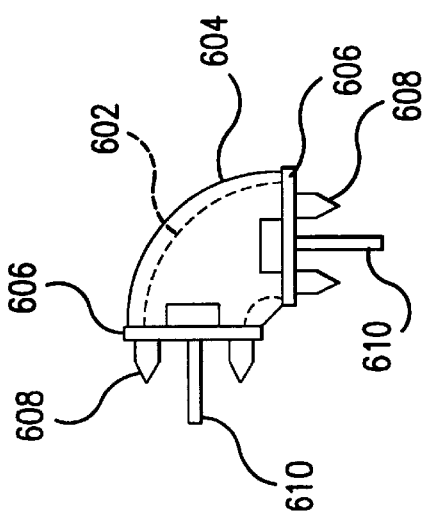

FIG. 6K shows the end plates or other hardware that is added to permit accurate location of the connector assembly to the PCB, and to permit retention of the connector and daughter card to the backplane. Note that the connector may alternatively be bolted to the daughter card, and held in place to the backplane by card cage mechanical features such as levers, cams, thumbscrews or other devices. The connector may also be constructed such that it has ball grid array (BGA) technology solder balls, solder columns, or solder paste applied to the pads at the daughter card interface, and it may be reflow soldered for a semi-permanent attachment to the daughter card.

FIG. 6L illustrates that the connector length, number of layers, and other physical form factors may be adjusted as needed by each potential application, or a series of standard shapes and sizes may be developed.

FIG. 7A through FIG. 7D are drawings showing four of the more efficient types of stripline layers that may be constructed in the connector. Generally, any structure that may be created in a PCB may be created in the connector.

The stripline shown in FIG. 7A is a single conductor 704 sandwiched between two power/ground planes 702 and 708.

FIG. 7B shows a type of dual conductor stripline commonly referred to as edge coupled for differential signals, with the two signal traces 712 and 714 sandwiched between two power/ground planes 710 and 716.

FIG. 7C shows an asymmetric stripline, where the two signal traces 720 and 722 are horizontally offset and also on different conducting layers sandwiched between two power/ground planes 718 and 724.

FIG. 7D shows a type of dual conductor stripline commonly referred to as broadside coupled for differential signals, where the two signal traces 728 and 730 are on different conducting layers sandwiched between two power/ground planes 726 and 732.

Figure 8A:
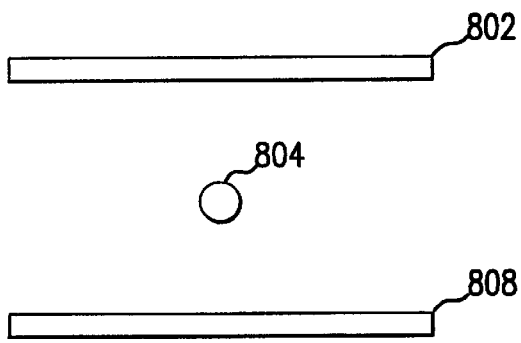
FIG. 8A and FIG. 8B are drawings of two different types of embedded-wire constructions.
Figure 8B:
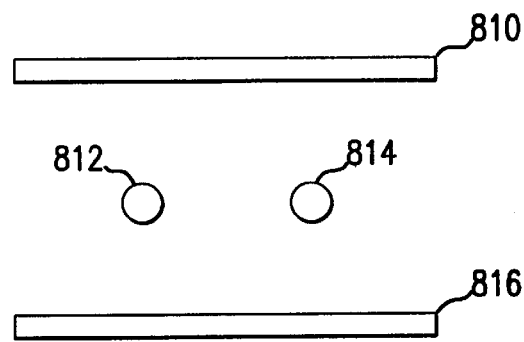

FIG. 8A and FIG. 8B are drawings of two different types of embedded-wire constructions. Other constructions using embedded wires are also possible.

FIG. 8A shows a single conductor 804 sandwiched between two power/ground planes 802 and 808. FIG. 8B shows a dual conductor such as for a differential signal with two signal wires 812 and 814 sandwiched between two power/ground planes 810 and 816.

FIG. 9 is a detailed view of the cut line 902 axially through a cylindrical printed circuit board, and the layers formed by the various process steps. Dimensions are given for the case with signals on a 40-mil (1.016 millimeters) grid. Other spacings are possible. In the 40-mil (1.016 millimeters) grid example, 904 is the edge at 0.0 millimeters. 906 is at 0.635 millimeters. 908 is at 1.651 millimeters. 910 is at 2.667 millimeters. 912 is at 3.683 millimeters. 914 is at 4.699 millimeters. 916 is at 5.715 millimeters. 918 is at 6.731 millimeters. 920 is at 7.747 millimeters. 922 is at 8.763 millimeters. 924 is at 9.779 millimeters. The other edge 926 is at 10.414 millimeters. Each of the signal traces 930 is sandwiched between two power/ground planes 928 and 932.

FIG. 10 is a side view 1000 of a cylindrical printed circuit board 1006 prior to cutting, with square cutouts 1002 and 1004 in place. The cutouts 1002 and 1004 enable selective attachments to power/ground as shown in FIG. 3. Each cutout 1002 and 1004 represents a location where a signal trace will connect to a pad.

FIG. 11 and FIG. 12 illustrate an alternate embodiment of this invention. Another method of constructing the connector is to use a flat process with 45 degree cuts.

FIG. 11 is a side view of a 90-degree connector 1100 built using a flat PCB process. Power/ground planes 1102 surround signal planes 1104 and these planes connect to a plurality of pads 1106.

FIG. 12 is a drawing of a flat PCB 1200 with cut-lines to form a number of 90-degree connectors. The power/ground/signal planes 1204 are built in a normal PCB process. The PCB is then cut along 45-degree lines 1202 to produce a number of 90-degree connectors. These 90-degree connectors will have either isosceles right triangle or isosceles trapezoid cross-sections depending on the spacing of the cut lines. This connector retains the same flexibility in number and type of layers described previously in this document, and uses the same selective pad attach to ground, achieved by selective imaging of each layer. In the case of the flat connector, the images are shifted laterally to create a 45-degree "slot" through the material in areas that are to be cleared of copper. Pads are imaged and formed as shown previously in this document.

Another embodiment of this invention may build the connector from the inside out, rather than rolling on a center core form. In this case, the form would be a hollow cylinder that would rapidly rotate about the center axis. Sprayed, rolled, or slurried materials could be precisely deposited in this fashion. Stepper motor control, combined with accurate spray or other deposition methods may be employed to precisely deposit dielectrics and conductors as required to build the shapes needed.

Another embodiment of this invention is a process for constructing the embedded wire striplines shown in FIG. 8 that involves winding a continuous spiral of wire about a rotating cylinder. The pads may be offset a small amount to make up for the positional variations induced by the spiral. When the cylinder is cut, the wire ends are available for plating pads.

Further embodiments of this invention may include bonding sites on the laminated board for placement of surface mount devices. These devices may include capacitors and/or resistors for series or parallel termination of the connector signals. Also the bonding sites may be used to provide locations for circuitry used for impedance control or current limitation of the connector signals. Many possible circuits may be fabricated through the use of bonding sites on the surface of the connector. Possibilities include signal buffers and optical isolators. One skilled in the art will recognize other possible circuits that may benefit from physical placement on the connector.

A pin version of the connector may be constructed utilizing pins that are affixed onto the pads of the connector using processes similar to those used to attach pins to pin grid array (PGA) integrated circuit packages. The pins may then be soldered in place on the daughter card and/or backplane, or may be inserted into a socket array for detachable connections.

Other embodiments of this invention may construct connectors at angles other than 90-degrees for special board connection needs.

The foregoing description of the present invention has been presented for purposes of illustration and description.

It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to particular use contemplated. It is intended that the appended claims be construed to include other alternative embodiments of the invention except insofar as limited by the prior art.

What is claimed is:

1. A laminated connector assembly for electrically and mechanically connecting a first circuit board to a second circuit board, said laminated connector assembly comprising:
   a rigid laminated board, comprising at least one conductive layer and at least one dielectric layer, wherein said laminated board has a first surface and a second surface, also wherein said first surface is substantially perpendicular to said second surface, also wherein said at least one conductive layer electrically connects at least one conducting contact located on said first surface to at least one conducting contact located on said second surface.

2. The laminated connector assembly as recited in claim 1 further comprising:
   two end plates attached to said laminated board permitting accurate location of said connector assembly to said first circuit board and said second circuit board wherein said end plates mechanically connect said first and second circuit boards.

3. The laminated connector assembly as recited in claim 2 wherein:
   said rigid laminated board is a section of a cylindrically constructed circuit board.

4. The laminated connector assembly as recited in claim 2 wherein:
   said rigid laminated board is a planar printed circuit board sectioned at 45-degree angles forming connectors with isosceles right triangle cross-sections.

5. The laminated connector assembly as recited in claim 2 wherein:
   said rigid laminated board is a planar printed circuit board sectioned at 45-degree angles forming connectors with isosceles trapezoid cross-sections.

6. A laminated connector assembly for electrically and mechanically connecting a first circuit board to a second circuit board, said laminated connector assembly comprising:
   a rigid laminated board, comprising at least one conductive layer and at least one dielectric layer, wherein said laminated board has a first surface and a second surface, also wherein said first surface is substantially perpendicular to said second surface;
   at least one conducting contact connected to said first surface;
   at least one conducting contact connected to said second surface;
   a mechanical connector for mechanically connecting said laminated board to said first circuit board and said second circuit board; and
   an electrical connector for electrically connecting said first surface conducting contacts to said first circuit board and non-permanently electrically connecting said second surface conducting contacts to said second circuit board;
   wherein said conductive layer electrically connects at least on said first surface conducting contacts to at least one said second surface conducting contacts.

7. The laminated connector assembly as recited in claim 6 wherein:
   said rigid laminated board is a section of a cylindrically constructed circuit board.

8. The laminated connector assembly as recited in claim 7 further comprising:
   placement sites for surface mount components on said rigid laminated board.

9. The laminated connector assembly as recited in claim 7 wherein:
   said rigid laminated board is constructed in a stripline configuration.

10. The laminated connector assembly as recited in claim 7 wherein:
    said conducting contacts include ball grid array technology solder balls.

11. The laminated connector assembly as recited in claim 7 wherein:
    said conducting contacts include pin grid array technology pins.

12. The laminated connector assembly as recited in claim 6 wherein:
    said rigid laminated board is a planar printed circuit board sectioned at 45-degree angles forming connectors with isosceles right triangle cross-sections.

13. The laminated connector assembly as recited in claim 12 further comprising:
    placement sites for surface mount components on said rigid laminated board.

14. The laminated connector assembly as recited in claim 12 wherein:
    said rigid laminated board is constructed in a stripline configuration.

15. The laminated connector assembly as recited in claim 12 wherein:
    said conducting contacts include ball grid array technology solder balls.

16. The laminated connector assembly as recited in claim 12 wherein:
    said conducting contacts include pin grid array technology pins.

17. The laminated connector assembly as recited in claim 6 wherein: said rigid laminated board is a planar printed circuit board sectioned at 45-degree angles forming connectors with isosceles trapezoid cross-sections.

18. The laminated connector assembly as recited in claim 17 further comprising:
    placement sites for surface mount components on said rigid laminated board.

19. The laminated connector assembly as recited in claim 17 wherein:
    said rigid laminated board is constructed in a stripline configuration.

20. The laminated connector assembly as recited in claim 17 wherein:
    said conducting contacts include ball grid array technology solder balls.

21. The laminated connector assembly as recited in claim 17 wherein:
    said conducting contacts include pin grid array technology pins.

* * * * *

UNITED STATES PATENT AND TRADEMARK OFFICE
CERTIFICATE OF CORRECTION

PATENT NO.     : 6,280,201 B1                                        Page 1 of 1
DATED          : August 28, 2001
INVENTOR(S)    : Morris It is certified that error appears in the above-identified patent and that said Letters Patent is hereby corrected as shown below:

Column 4,
Line 33, delete "112" and insert therefor -- 114 --
Line 34, delete "114" and insert therefor -- 112 --

Column 5,
Line 5, after "ground layers" delete "310" and insert therefor -- 308 --

Column 7,
Line 4, delete "The surface pads are shown in FIG. 6J." and insert therefor
-- FIG. 6J shows a single quadrant of the cylindrical printed circuit board 602. Pads 603 are shown on a surface of the cylindrical quadrant 602. --
Line 4, after "These" insert -- pads --
Line 15, after "backplane." insert -- A connector end plate 604 is shown attached to one end of the cylindrical quadrant 602 of the circuit board. Along two edges 606 of the end plate 604 are mechanical connectors 608 and electrical connectors 610. The mechanical connectors 608 may be tapered such that when they are inserted in holes, the taper will tend to align the entire connector assembly to the circuit board that it is being connected to. The electrical connectors 610 are shown as pin grid array style pins in this figure but other types of electrical connectors may be used. --

Column 8,
Line 13, after "pads 1106." insert -- Also note that placement sites 1108 for surface mount components 1110 may be placed on the connector surface if desired. --

Signed and Sealed this

Second Day of December, 2003

JAMES E. ROGAN
*Director of the United States Patent and Trademark Office*